United States Patent
Wang et al.

(10) Patent No.: US 6,559,039 B2
(45) Date of Patent: May 6, 2003

(54) DOPED SILICON DEPOSITION PROCESS IN RESISTIVELY HEATED SINGLE WAFER CHAMBER

(75) Inventors: Shulin Wang, Campbell, CA (US); Lee Luo, Fremont, CA (US); Steven A. Chen, San Jose, CA (US); Errol Sanchez, Dublin, CA (US); Xianzhi Tao, San Jose, CA (US); Zoran Dragojlovic, San Jose, CA (US); Li Fu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/858,821

(22) Filed: May 15, 2001

(65) Prior Publication Data

US 2002/0173127 A1 Nov. 21, 2002

(51) Int. Cl.[7] .................. H01L 21/24; H01L 21/40; H01L 21/22
(52) U.S. Cl. .................................. 438/542; 438/541
(58) Field of Search ................... 438/541, 542, 438/764, 783

(56) References Cited

U.S. PATENT DOCUMENTS 5,994,209 A * 11/1999 Yieh et al. .................. 438/541

FOREIGN PATENT DOCUMENTS

| EP | 0935281 A | 8/1999 |
|---|---|---|
| WO | 9945167 A | 9/1999 |
| WO | 0018982 A | 4/2000 |
| WO | 0201615 A | 1/2002 |

* cited by examiner

Primary Examiner—Alexander Ghyka
(74) Attorney, Agent, or Firm—Blakely Sokoloff Taylor & Zafman

(57) ABSTRACT

A method for depositing doped polycrystalline or amorphous silicon film. The method includes placing a substrate onto a susceptor. The susceptor includes a body having a resistive heater therein and a thermocouple in physical contact with the resistive heater. The susceptor is located in the process chamber such that the process chamber has a top portion above the susceptor and a bottom portion below the susceptor. The method further includes heating the susceptor. The method further includes providing a process gas mix into the process chamber through a shower head located on the susceptor. The process gas mix includes a silicon source gas, a dopant gas, and a carrier gas. The carrier gas includes nitrogen. The method further includes forming the doped silicon film from the silicon source gas.

41 Claims, 5 Drawing Sheets

DOPED SILICON DEPOSITION PROCESS IN RESISTIVELY HEATED SINGLE WAFER CHAMBER

FIELD OF THE INVENTION

The present invention relates to the field of a semiconductor processing and more specifically to a method and apparatus for controlling the deposition of a silicon film.

BACKGROUND

FIG. 1 illustrates an example of a radiantly-heated semiconductor substrate processing chamber. Such chambers are generally used at process pressures less than or approaching 100 Torr. The single substrate reactor 100 includes top wall 132, sidewalls 133 and bottom wall 134 that define the reactor 100 into which a single substrate, such as a wafer 102, can be loaded. The wafer 102 is placed on susceptor 105 that is rotated by motor 137 to provide a time averaged environment for the wafer 102 that is generally disk-shaped. The susceptor and wafer are heated, and process gases are pumped through the chamber 130. The process gases flow across the surface of the wafer in the direction of arrows 141. The process gases contain the chemical species that react at the heated wafer surface to form a film on the wafer. The wafer is rotated in an effort to provide uniform gas depletion across the wafer.

Preheat ring 140 is supported in the chamber 130 and surrounds the wafer 102. The wafer 102, susceptor 105, and preheat ring 140 are heated by light from a plurality of high intensity lamps 138 and 139 mounted outside of reactor 100. Top wall 132 and bottom wall 134 of chamber 130 are typically made of quartz and are substantially transparent to light to enable the light from external lamps 138 and 139 to enter reactor 100 and heat susceptor 105, the wafer 102, and preheat ring 140.

Although the rotation of the substrate and thermal gradients caused by the heat from lamps 138 and 139 can affect the flow profile of the gases in reactor 100, the dominant shape of the flow profile is a laminar flow from the gas input port 110 and across preheat ring 140 and the wafer to exhaust port 111.

In a radiantly-heated reactor 100, the temperature within the chamber is measured optically with a pyrometer 150 that is typically located below the chamber 130. The pyrometer 150 measures the optical intensity 152 emitted by the heated susceptor 105. Since the radiation emitted by the heated susceptor depends on the susceptor temperature, the susceptor temperature can be calculated by measuring the intensity with the pyrometer 150. Because the emissivity of the susceptor is dependent on the surface conditions of the susceptor and the quartz dome or bottom wall 134 through which the emissivity of the susceptor is measured, the wafer temperature is not directly measured and therefore can be inaccurate. A pyrometer 150 is typically used to measure the susceptor temperature, or to determine the wafer temperature, because it is difficult to physically measure the temperature of the wafer during processing because the wafer rests on the rotating susceptor 105. Because the susceptor is a rotating body, it is difficult to attach a measuring device such as a thermocouple directly to the susceptor to physically measure the temperature of the susceptor. Also, since the emissivity of the heated susceptor is measured by the pyrometer 150 through the quartz wall 134, and is dependent on the surface conditions of susceptor 105 and the quartz wall 134, it is necessary to periodically clean the surfaces of the chamber including the quartz wall 134 and the bottom surface of the susceptor 105, because the residue from the processing gases tends to accumulate on these surfaces and can affect the emissivity of the surfaces, thus introducing inaccuracy in the temperature measurement.

The uniformity of film thickness is measured in two ways. First, wafer-to-wafer uniformity is measured, and also uniformity across the surface of individual wafers is measured.

Since the film thickness is dependent on temperature, among other parameters, it is important to accurately control the temperature within the processing chamber. Therefore, the thermal deposition processes that are performed in such a chamber having optical temperature measurement can be limited by the relative inaccuracy of such a temperature measuring system.

Current film deposition reactors such as reactor 100 shown in FIG. 1 use hydrogen as a carrier or dilution gas. Hydrogen is used because hydrogen gas has a relatively high thermal conductivity (as compared to nitrogen, for instance). The thermal conductivity of hydrogen gas provides a large enough temperature gradient between the wafer and the chamber or reactor dome. A relatively large temperature gradient helps to avoid gas phase nucleation which results in silane decomposition on the dome and a resulting coating on the dome. When gas phase nucleation and dome coating occurs, less of the gas species is reacted at the wafer, resulting in non-uniform film thickness on the wafer. Hydrogen gas and a large temperature gradient can reduce silane decomposition due to gas phase nucleation and dome coating. Consequently, less of the gas species is used, resulting in a less efficient process.

A radiantly heated film deposition chamber therefore is very sensitive to process fluctuations, and in particular, temperature fluctuations which result in potentially non-uniform film thickness. One problem associated with fluctuating wafer temperatures is non-uniform film thickness of the wafer. Significant effort has been expended to improve process parameters to increase uniformity of film thickness, both on a wafer-to-wafer and individual wafer basis. There are also problems associated with the rotation of the susceptor, such as wobble or vibration, which require highly complex solutions.

In radiantly-heated processing reactors, the feed stock consumption is relatively high, meaning that the amount of reactant such as silane or disilane used compared to the amount of product deposited (i.e., deposition rate of the film) is high resulting in a low process efficiency. Also, because a large amount of feed stock is used, these types of reactors require frequent maintenance, thus increasing the cost and down time of the processing machinery.

Another semiconductor substrate process in which thickness uniformity and repeatability is important is chemical vapor deposition (CVD). CVD amorphous silicon films have been used in gap fill applications due to the excellent step coverage ability. With the shrinkage of device geometry, it is desirable that the deposited film has a conformal gap fill profile for the sub-micron patterns. Most amorphous silicon films are currently batch processed by furnaces, even though furnaces have the disadvantage of long cycle time. Furthermore, the low temperature nature of the amorphous silicon process limits the throughput during manufacturing. A process which could achieve excellent gap filling quality and high throughput is desirable in single wafer deposition technology.

SUMMARY

A method for depositing doped polycrystalline or amorphous silicon film is described. The method includes placing a substrate onto a susceptor. The susceptor includes a body having a resistive heater therein and a thermocouple in physical contact with the resistive heater. The susceptor is located in the process chamber such that the process chamber has a top portion above the susceptor and a bottom portion below the susceptor. The method further includes heating the susceptor. The method further includes providing a process gas mix into the process chamber through a shower head located on the susceptor. The process gas mix includes a silicon source gas and a carrier gas. The carrier gas includes nitrogen with hydrogen as an additional dilution gas. The method further includes forming the doped silicon film from the silicon source gas.

DETAILED DESCRIPTION

A method and apparatus for in situ deposition of a doped polycrystalline or amorphous silicon film is disclosed. According to one embodiment, a substrate or wafer is placed onto a support in a chamber. The support is then heated and a desired pressure maintained in the chamber. A process gas mix comprising a silicon source gas such as, but not limited to, silane ($SiH_4$) or disilane ($Si_2H_6$) and a carrier or dilution gas mix comprising hydrogen ($H_2$) and inert gas such as but not limited to nitrogen ($N_2$), helium (He), or argon (Ar) is then fed into the chamber. The hydrogen gas typically comprises between 8–20% of the dilution gas mix by volume and preferably between 10–15% by volume. Heat from the substrate or support causes the silicon source gas to thermally decompose and form a polycrystalline or amorphous silicon film on the wafer. For both doped polycrystalline silicon and doped amorphous silicon, the dopant flow is determined by the dopant to silane ratio. Exemplary n-type dopants include arsine ($AsH_3$) and phosphine ($PH_3$). An example of a p-type dopant is diboron ($B_2H_6$). The dopant flow to $SiH_4$ or $Si_2H_6$ flow ratio can be up to 1%. The dopant concentration in the silicon film can be up to $10^{21}$ atoms per cubic centimeter.

The polycrystalline or amorphous silicon deposition process of the present invention is ideal for use in a thermal deposition chamber having aluminum sidewalls and an aluminum nitride wafer support with a resistive heater contained therein and with an overhead shower head for gas injection into the chamber. The resistive heater includes a thermocouple in physical contact with the heater such that the process temperature can be more accurately and directly measured, and thus more accurately controlled to allow for more efficient feed stock decomposition resulting in a more stable process that yields more uniform film thickness and repeatability. The wafer temperature is therefore more constant even for wafers having different thicknesses, films, or pattern density. Although the present invention is described relative to a resistively heated processing chamber, it is to be appreciated that other types of processing chambers may be used in conjunction with the techniques described herein.

A doped polycrystalline or amorphous silicon film is deposited by the process of the present invention. The process gas mix includes a silicon source gas and $N_2$ as the carrier or dilution gas. A $N_2$ purge gas is provided in the bottom portion of the chamber to confine the silicon to the top portion of the chamber. Since $N_2$ is used as the carrier or dilution gas and as the bottom purge gas, the reactant gases (silane or disilane, for example) are confined to the region between the shower head and the heater, the silicon deposition rate onto the substrate is enhanced.

Figure 1:
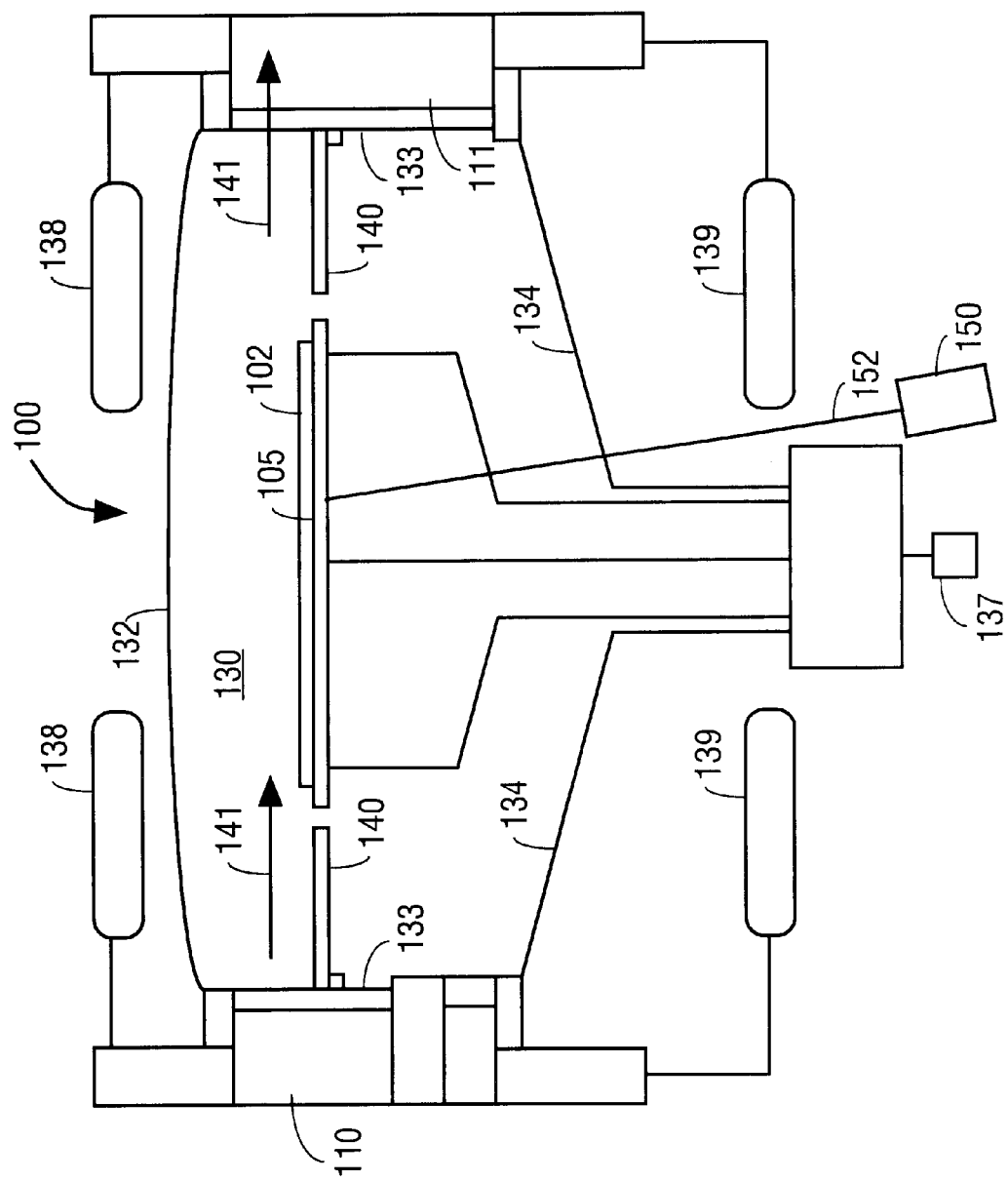
FIG. 1 is a side-elevational view of a radiantly-heated semiconductor processing chamber.
Figure 2:
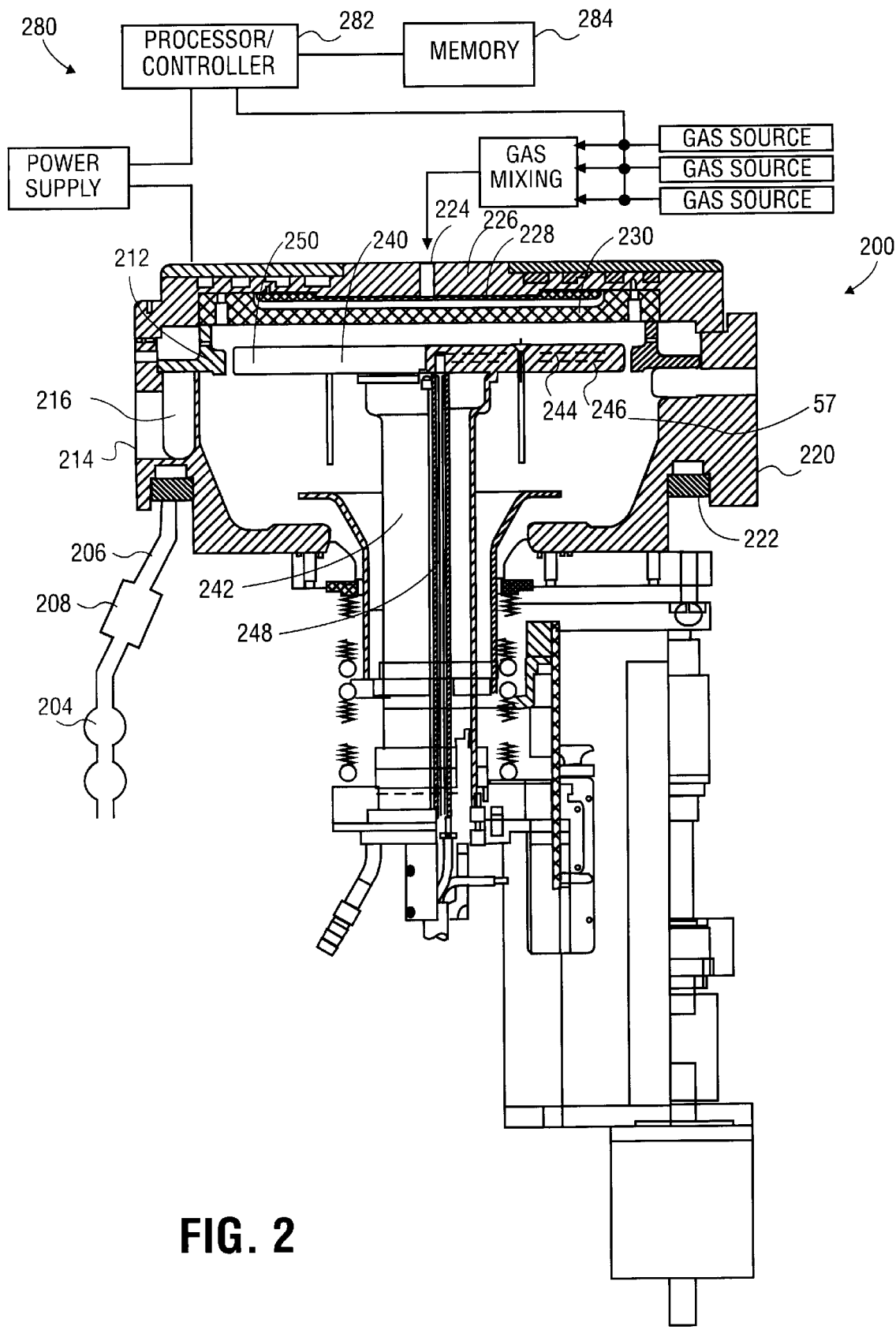
FIG. 2 is a cross-sectional side view of a processing chamber including a resistive heater in a "wafer-process" position in accordance with embodiments of the invention through first cross-section and a second cross-section each through one-half of the chamber.
Figure 3:
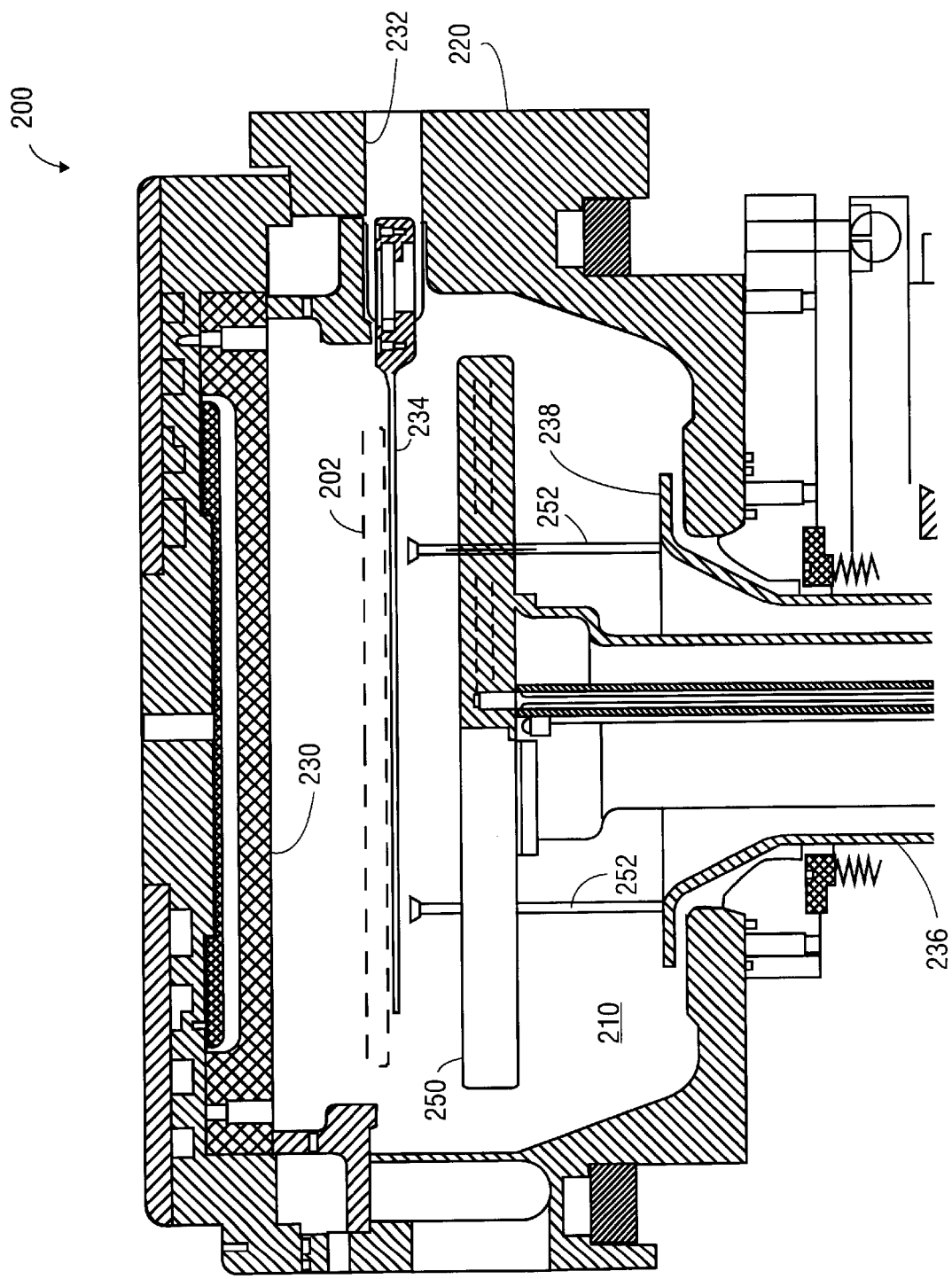
FIG. 3 is a similar cross-sectional side view as in FIG. 2 in a wafer load position.
Figure 4:
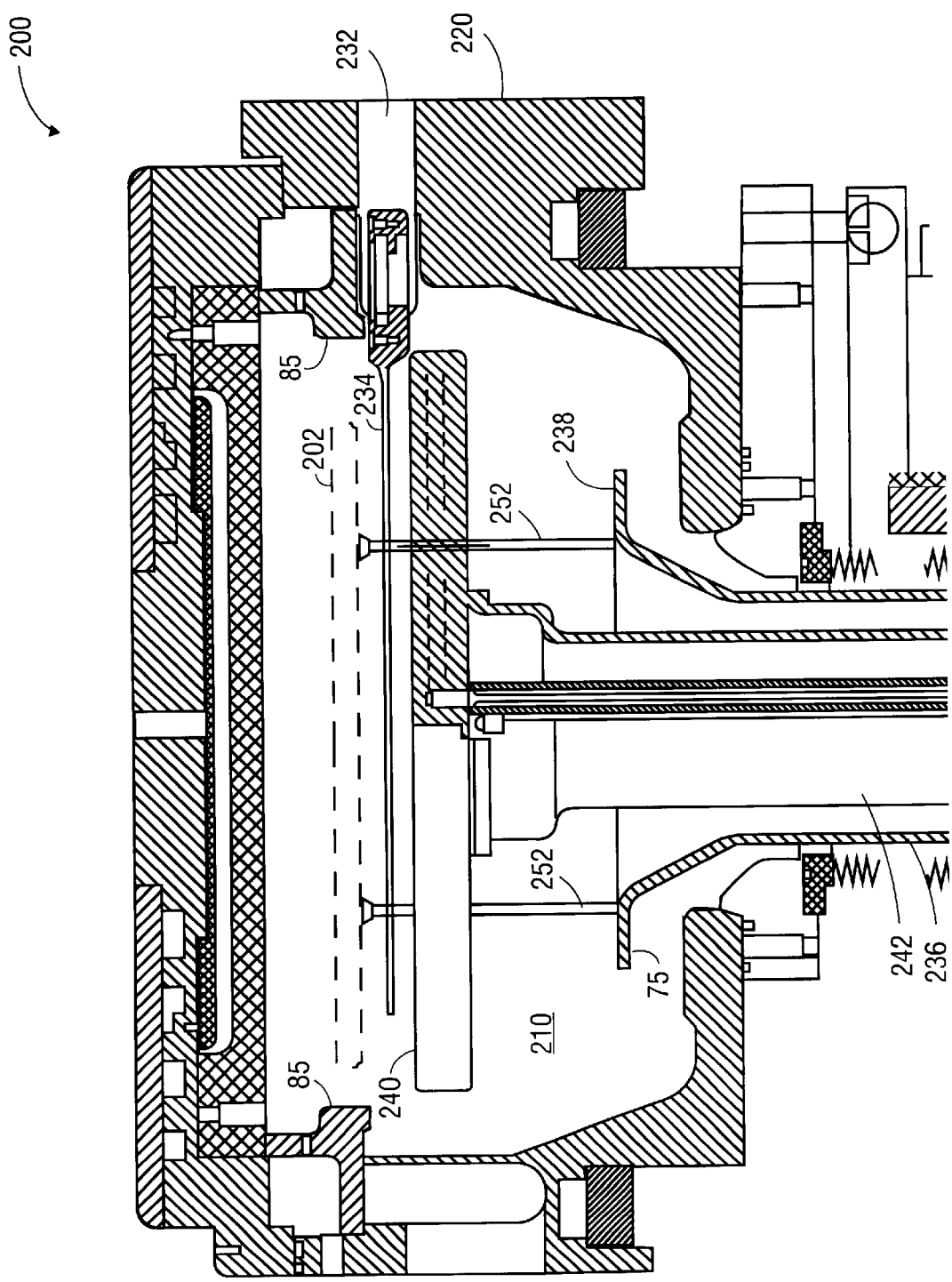
FIG. 4 is a similar cross-sectional side view as in FIG. 2 in a wafer separate position.

Referring to the drawings, a low-pressure chemical vapor deposition (LPCVD) chamber is described. FIGS. 2–4 each show cross-sectional views of one type of reactor such as a resistive reactor 200 used to practice the invention. FIGS. 2–4 each show cross-sectional views of a chamber through two different cross-sections, each cross-section representing a view through approximately one-half of the chamber.

The LPCVD reactor 200 illustrated in FIGS. 2–4 is constructed of materials such that, in this embodiment, a pressure of greater than or equal to 100 Torr can be maintained. For the purpose of illustration, a chamber 210 of approximately in the range of 5–6 liters is described. FIG. 2 illustrates the inside of process chamber body 220 in a "wafer-process" position. FIG. 3 shows the same cross-sectional side view of the chamber in a "waferload" position. FIG. 4 shows the same view of the chamber in a "wafer-separate" position. In FIGS. 3 and 4 a wafer 202 is indicated in dashed lines to indicate its location in the chamber.

FIGS. 2–4 show chamber body 220 that defines reaction chamber 210 in which the thermal decomposition of a process gas or gases takes place to form a film on a wafer (e.g., a CVD reaction). Referring to FIG. 2, chamber body 220 is constructed, in one embodiment, of aluminum and has passages 222 for water to be pumped therethrough to cool chamber body 220 (e.g., a "cold-wall" reaction chamber). Resident in chamber 210 is resistive heater 240 including, in this view, susceptor 250 supported by shaft 242. Susceptor 250 has a surface area sufficient to support a substrate such as a semiconductor wafer (not shown).

Process gas enters otherwise sealed chamber 210 through gas distribution port 224 in a top surface of chamber lid 226 of chamber body 220. The process gas then goes through blocker plate 228 to distribute the gas about an area consistent with the surface area of a wafer. Thereafter, the process gas is distributed through perforated face plate 230 located, in this view, above resistive heater 240 and coupled to chamber lid 226 inside chamber body 220. The combination of blocker plate 228 with face plate 230 in this embodiment creates a uniform distribution of process gas at the substrate, e.g., wafer.

Referring to FIG. 3, substrate 202, such as a wafer, is inserted into chamber 210 to be placed on susceptor 250 of heater 240 through entry port 232 in a side portion of chamber body 220. To accommodate a wafer for processing, heater 240 is lowered so that the surface of susceptor 250 is below entry port 232 as shown in FIG. 3. Typically by a robotic transfer mechanism, a wafer is loaded by way of, for example, a transfer blade 234 into chamber 210 onto the superior (top) surface of susceptor 250.

After the substrate 202 carried into the chamber 210 by transfer blade 234, as shown in FIG. 3, lifter assembly 236 is moved in a superior direction such that lift plate 238 pushes upwardly against lift pins 252 that are slidably disposed through openings or throughbores in susceptor 250. FIG. 4 shows the lift pins 252 are as they lift substrate 202 off transfer blade 234 so that transfer blade 234 may be withdrawn through entry port 232 and removed from the chamber 210. Heater 240 is also moved slightly upwardly by moveable shaft 242.

Once substrate 202 is loaded, and blade 234 withdrawn, entry 232 is sealed and heater 240 is further advanced in a superior (i.e., upward) direction toward face plate 230 by lifter assembly 236 that includes, for example, a step motor. Lift plate 238 and lift pins 252 remain at this height while heater 240 is raised to contact the substrate 202 resting on pins 252. As heater 240 advances upwardly, substrate 202 is lifted off pins 252 and is thus positioned on susceptor 250. The advancement stops when the wafer 202 is a short distance (e.g., 400–700 mils) from face plate 230 (see FIG. 2). In the wafer-process position (FIG. 2), chamber 210 is effectively divided into two zones, a first zone above the superior surface of susceptor 250 and a second zone below the inferior (bottom) surface of susceptor 250. It is generally desirable to confine film formation to the first zone.

Referring again to FIG. 2, process gas controlled by a gas panel flows into chamber 210 through gas distribution port 224, through blocker plate 228 and perforated face plate 230. Process gas thermally decomposes to form a film on the wafer. At the same time, an inert bottom-purge gas, e.g., nitrogen, is introduced into the second chamber zone to inhibit film formation in that zone. In a pressure controlled system, the pressure in chamber 210 is established and maintained by a pressure regulator or regulators (not shown) coupled to chamber 210. In one embodiment, for example, the pressure is established and maintained by pressure regulator(s) coupled to chamber body 220 as known in the art.

A pumping plate 212 surrounds the susceptor 250 when the susceptor is in the processing position, as shown in FIG. 2. Residual process gas is pumped from chamber 210 through pumping plate 212 to a collection vessel at a side of chamber body 220 (vacuum pumpout 214). Pump 204 disposed exterior to the apparatus provides vacuum pressure within pumping channel 216 to draw both the process and purge gases out of the chamber 210 through vacuum pumpout 214. The gas is discharged from chamber 210 along a discharge conduit 206. The flow rate of the discharge gas through channel 216 is preferably controlled by a throttle valve 208 disposed along conduit 206. The pressure within processing chamber 210 is monitored with sensors (not shown) and controlled by varying the cross-sectional area of conduit 206 with throttle valve 208. Preferably, a controller or processor receives signals from the sensors that indicate the chamber pressure and adjusts throttle valve 208 accordingly to maintain the desired pressure within chamber 210. A suitable throttle valve for use with the present invention is described in U.S. Pat. No. 5,000,225 issued to Murdoch and assigned to Applied Materials, Inc., of Santa Clara, Calif.

In one embodiment, LPCVD reactor 200 includes a control system 280. In one embodiment, control system 280 includes processor/controller 282 and a memory 284, such as a hard disk drive. The processor/controller 282 includes a single board (SBC) analog and digital input/output boards, interface boards and stepper motor controller board. Processor/controller 282 controls all activity of the LPCVD chamber. The system controller executes system control software, which is a computer program stored in a computer readable medium such as memory 284. The computer program includes sets of instructions that dictate the timing, mixture of gases, chamber pressure, heater temperature, power supply, susceptor position, and other parameters of the polysilicon deposition process of the present invention. The computer program code can be written in any conventional computer readable programming language such as 68000 assembly language, C, C++, Pascal, Fortran, or others. Subroutines for carrying out process gas mixing, pressure control, and heater control are stored within memory 284. Also stored in memory 284 are process parameters such as process gas flow rates and compositions, temperatures, and pressures necessary to form a polycrystalline or amorphous silicon film. Thus, in one exemplary embodiment, LPCVD reactor 200 includes in memory 282 instructions and process parameters for: providing a silicon source gas and a dilution gas mix into chamber 210 wherein the dilution gas mix comprises $H_2$ and $N_2$; for heating the susceptor 250 to a selected temperature; and for generating a pressure within chamber 210 so that a doped silicon film can be deposited by thermal chemical vapor deposition onto a wafer.

Once wafer processing is complete, chamber 210 may be purged, for example, with an inert gas, such as nitrogen. After processing and purging, heater 240 is advanced in an inferior direction (e.g., lowered) by lifter assembly 236 to the position shown in FIG. 4. As heater 240 is moved, lift pins 252, having an end extending through openings or throughbores in a surface of susceptor 250 and a second end extending in a cantilevered fashion from an inferior (e.g., lower) surface of susceptor 250, contact lift plate 238 positioned at the base of chamber 210. As is illustrated in FIG. 4, in one embodiment, at the point, lift plate 238 remains at a wafer-process position (i.e., the same position the plate was in FIG. 2). As heater 240 continues to move in an inferior direction through the action of assembly 236, lift pins 252 remain stationary and ultimately extend above the susceptor or top surface of susceptor 250 to separate a processed wafer from the surface of susceptor 250. The surface of susceptor 250 is moved to a position below entry port 232.

Once a processed wafer is separated from the surface of susceptor 250, transfer blade 234 of a robotic mechanism is inserted through entry port 232 beneath the heads of lift pins 252 and a wafer supported by the lift pins. Next, lifter assembly 236 inferiorly moves (e.g., lowers) heater 240 and lifts plate 238 to a "wafer load" position. By moving lift plates 238 in an inferior direction, lift pins 252 are also moved in an inferior direction, until the surface of the processed wafer contacts the transfer blade as shown in FIG. 3. The processed wafer is then removed through entry port 232 by, for example, a robotic transfer mechanism that removes the wafer and transfers the wafer to the next processing step. A second wafer may then be loaded into chamber 210. The steps described above are generally reversed to bring the wafer into a process position. A detailed description of one suitable lifter assembly 236 is described in U.S. Pat. No. 5,772,773, assigned to Applied Materials, Inc. of Santa Clara, Calif.

In a high temperature operation, such as LPCVD processing to form a silicon film, the heater temperature inside chamber 210 can be as high as 740° C. or more. Accordingly, the exposed components in chamber 210 must be compatible with such high temperature processing. Such materials should also be compatible with such high temperature processing. Such materials should also be compatible with the process gases and other chemicals, such as cleaning chemicals (e.g., $NF_3$) that may be introduced into chamber 210. Exposed surfaces of heater 240 may be comprised of a variety of materials provided that the materials are compatible with the process. For example, susceptor 250 and shaft 242 of heater 240 may be comprised of similar aluminum nitride material. Alternatively, the surface of susceptor 250 may be comprised of high thermally conductive aluminum nitride materials (on the order of 95% purity with a thermal conductivity from 140 W/mK while shaft 242 is comprised of a lower thermally conductive aluminum nitride. Susceptor 250 of heater 240 is typically bonded to shaft 242 through diffusion bonding or brazing as such coupling will similarly withstand the environment of chamber 210.

FIG. 2 also shows a cross-section of a portion of heater 240, including a cross-section of the body of susceptor 250 and a cross-section of shaft 242. In this illustration, FIG. 2 shows the body of susceptor 250 having two heating elements formed therein, first heating element 244 and second heating element 246. Each heating element (e.g., heating element 244 and heating element 246) is made of a material with thermal expansion properties similar to the material of the susceptor. A suitable material includes molybdenum (Mo). Each heating element includes a thin layer of molybdenum material in a coiled configuration.

In FIG. 2, second heating element 246 is formed in a plane of the body of susceptor 250 that is located inferior (relative to the surface of susceptor in the figure) to first heating element 244. First heating element 244 and second heating element 246 are separately coupled to power terminals. The power terminals extend in an inferior direction as conductive leads through a longitudinally extending opening through shaft 242 to a power source that supplies the requisite energy to heat the surface of susceptor 250. Also of note in the cross-section of heater 240 as shown in FIG. 2 is the presence of thermocouple 248. Thermocouple 248 extends through the longitudinally extending opening through shaft 242 to a point just below the superior or top surface of susceptor 250.

Figure 5:
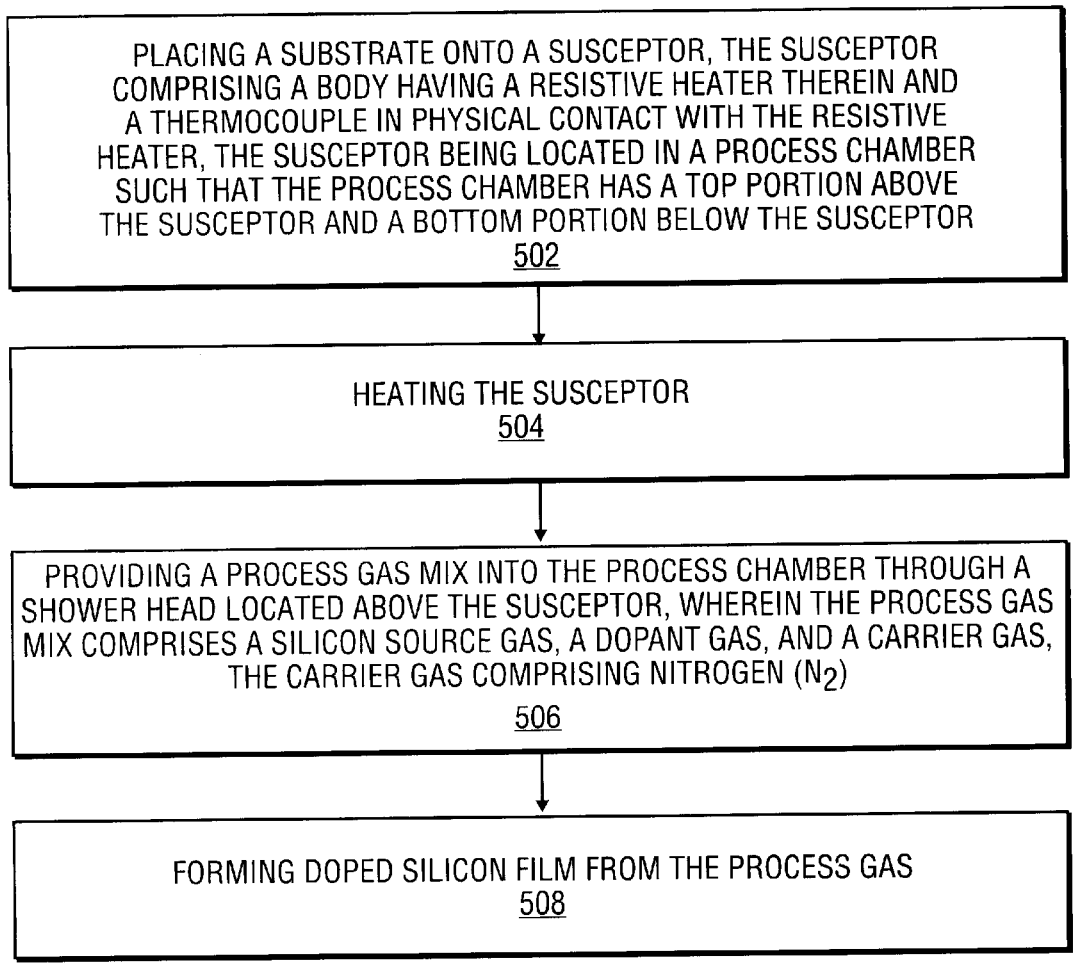
FIG. 5 is a flow chart illustrating an embodiment of the doped polycrystalline silicon deposition process of the present invention.

A method of depositing a doped silicon film will now be described with respect to flow chart 500 of FIG. 5 as well as with respect to the low-pressure chemical vapor deposition (LPCVD) chamber of FIGS. 2–4.

According to the present invention, as set forth in block 502 of flow chart 500, a wafer or substrate is placed onto a susceptor in a deposition chamber. The susceptor includes a body having a resistive heater therein and a thermocouple in physical contract with the resistive heater. The susceptor is located in the process chamber such that the process chamber has a top portion above the susceptor and a bottom portion below the susceptor.

In an exemplary embodiment in which the deposited doped silicon film is to be used as a gate electrode for a transistor of a semiconductor integrated circuit, the substrate will be a doped silicon wafer having a gate dielectric layer, such as silicon oxide or silicon oxynitride formed thereon. If the doped silicon film is to be used as an interconnect or capacitor electrode then the doped silicon film will be formed over an interlayer dielectric formed over a doped silicon wafer. The wafer is transferred into the chamber by a transfer blade as shown in FIG. 3. The heater is then raised from the wafer load position to the wafer process position as shown in FIG. 2.

Next, as set forth in block 504, the susceptor is heated to the desired deposition temperature. The process pressure and temperature are obtained and stabilized. While achieving pressure and temperature stabilization, a stabilization gas such as $N_2$, He, Hr, $H_2$ or combinations thereof are fed into the chamber. In one embodiment, the flow and concentration of the dilution gas used in the subsequent polysilicon deposition is used to achieve temperature and pressure stabilization. Using the dilution gas for stabilization enables the dilution gas flow and concentrations to stabilize prior to silicon deposition.

As set forth in block 506, the method further includes providing a process gas mix into the process chamber through a shower head located above the susceptor, wherein the process gas mix comprises a silicon source gas and a carrier gas, the carrier gas comprising nitrogen ($N_2$). Block 508 sets forth the operation of forming the doped silicon film from the silicon source gas.

In one embodiment, the chamber is evacuated to a pressure between 100–350 Torr and the heater temperature raised to between 580–740° C. while the carrier or dilution gas is fed into the chamber at a flow rate between 5–15 slm. According to the present invention the dilution gas consists of $H_2$ and an inert gas, such as but not limited to nitrogen ($N_2$), argon (Ar), and helium (He), and combinations thereof. For the purpose of the present invention an inert gas is a gas which is not consumed by or which does not interact with the reaction used to deposit the silicon film and does not interact with chamber components during silicon film deposition. In one embodiment of the present invention the inert gas consists only of nitrogen ($N_2$). In an embodiment of the present invention, $H_2$ comprises up to about 20% by volume of the dilution gas mix with the dilution gas mix preferably having between 10–15% $H_2$ by volume.

In one embodiment, the dilution gas mix is supplied into the chamber in two separate components. A first component of the dilution gas mix is fed through the distribution port in the chamber lid. The first component consist of all the $H_2$ used in the dilution gas mix and a portion (typically about ⅔) of the inert gas used in the dilution gas mix. The second component of the dilution gas mix is fed into the lower portion of the chamber beneath the heater and consists of the remaining portion (typically about ⅓) of the inert gas used in the dilution gas mix. Providing some of the inert gas through the bottom chamber portion helps prevent the silicon film from depositing on components in the lower portion of the chamber. In one embodiment of the present invention between 5–18 slm with about 9 slm being preferred of an inert gas (preferably $N_2$) is fed through the top distribution plate while between 3–10 slm, with about 5 or between 4–6 slm being preferred, of the inert gas (preferably $N_2$) is fed into the bottom or lower portion of the chamber. The desired percentage of $H_2$ in the dilution gas mix is mixed with the inert gas prior to entering distribution port.

Once the temperature, pressure, and gas flows have been stabilized a process gas mix comprising a silicon source gas, a dopant source gas, and a dilution gas mix comprising $H_2$ and an inert gas is fed into chamber to deposit a doped silicon film on the substrate. Exemplary dopants include phophine, arsine or diboron. The silicon source gas is preferably silane ($SiH_4$) but can be other silicon source gases such as disilane ($Si_2H_6$).

In one embodiment, a dopant gas mix is provided in the top portion of the chamber. In one exemplary embodiment, the dopant gas mix is phosphine ($PH_3$) diluted in hydrogen ($H_2$) or another dilutant and provided such that a pure phosphine flow rate of up to about 3 sccm can be provided. In another embodiment, the dopant gas mix is diboron ($B_2H_6$) diluted in hydrogen ($H_2$) or another dilutant with a pure diboron flow rate of up to about 3 sccm. In another embodiment, the dopant gas mix is arsine ($AsH_3$) diluted in hydrogen (H$_2$) or another dilutant with a pure arsine flow rate of up to about 3 sccm. The above described conditions can yield a doped polycrystalline or amorphous silicon film having a dopant concentration of up to about $10^{21}$ atoms per cubic centimeter. Typically, the dopant concentration is about $2\times10^{19}$ to about $5\times10^{20}$ atoms per cubic centimeter.

The thermal energy from susceptor and wafer causes the silicon source gas to thermally decompose and deposit a polycrystalline or amorphous silicon film on the gate dielectric or the interlayer dielectric of the silicon wafer. In one embodiment, only thermal energy is used to decompose the silicon source gas without the aid of additional energy sources such as plasma or photon enhancement. The resistively heated chamber allows more precise temperature control within a smaller range of temperatures. Thus, doped silicon deposition can be performed with better repeatability as a result of a more stable process temperature.

As process gas mix is fed into chamber 200, the silicon source gas decomposes to provide silicon atoms which in turn form a polycrystalline or amorphous silicon film on an insulating layer of the wafer. It is to be appreciated that H$_2$ is a reaction product of the decomposition of silane (SiH$_4$). By adding a suitable amount of H$_2$ in the process gas mix the decomposition of silane (SiH$_4$) is slowed which enables a silicon film to be formed with small and random grains. By having H$_2$ comprise between 8–20% of the dilution gas mix random grains having an average grain size between 50–500 Å can be formed.

Doped Polycrystalline Silicon Deposition

In one embodiment, for doped polycrystalline silicon film deposition, between 50–300 sccm, with about 80–200 sccm being preferred, of silane (SiH$_4$) is added to the dilution gas mix already flowing and stabilized during the temperature and pressure stabilization. If disilane (Si$_2$H$_6$) is used, the flow can be between 50–300 sccm, with the preferred range being about 50–150 sccm. During the deposition of polycrystalline silicon, a process gas mix comprising between 50–300 sccm of silane (SiH$_4$) or disilane (Si$_2$H$_6$) and between 5–15 slm of dilution gas mix comprising H$_2$ and an inert gas is fed into the chamber, with N2 being the preferred inert gas provided at a flow of about 9 slm in the top portion of the chamber and about 5 slm in the bottom portion of the chamber. The H$_2$ flow is preferably up to about 20%. The process gas includes a diluted dopant gas flow such that up to about 3 sccm of pure dopant flow is provided. The pressure in the chamber is maintained between 100–350 Torr, with about 200–300 Torr preferred. The temperature of the susceptor is maintained between 710–740° C. (It is to be appreciated that in the LPCVD reactor the temperature of the substrate or wafer is typically about 20–30° C. cooler than the measured temperature of susceptor.) In the preferred embodiment of the present invention the silicon source gas is added to the first component (upper component) of the dilution gas mix and flows into chamber through inlet port.

The deposition pressure, temperature, and process gas flow rates and concentration are chosen so that a doped polycrystalline silicon film is deposited at a rate between 1000–3000 Å per minute with more than about 1500 Å per minute being preferred. The process gas mix is continually fed into chamber until a doped polycrystalline silicon film of a desired thickness is formed. For gate and interconnect applications a polycrystalline silicon film having a thickness between 500–2000 Å has been found suitable.

Doped Amorphous Silicon Deposition

In one embodiment, for doped amorphous silicon film deposition the heater temperature is about 580° C. to about 620° C. The pressure in the chamber is maintained between about 100 Torr to about 350 Torr, with the preferred pressure range of about 200 Torr to about 300 Torr. Silane flow can be about 50 sccm to about 300 sccm, with a preferred silane flow of about 80 sccm to about 200 sccm. If disilane is used as the silicon source gas, the flow can be about 50 sccm to about 300 sccm, with about 50 sccm to about 150 sccm being preferred. The process gas includes a diluted dopant gas flow such that up to about 3 sccm of pure dopant flow is provided. The dilution gas mix of up to about 20% H$_2$ and an inert gas (preferably N$_2$) is provided at a flow rate of between about 5–15 slm, with about 9 slm of N$_2$ in the top portion of the chamber and about 5 slm of N$_2$ in the bottom portion of the chamber.

The above process parameter are chosen so that a doped amorphous silicon film is deposited at a rate of between 300–1000 Å per minute, with a preferred rate of 400 to about 700 Å per minute. In applications in which a thick amorphous film (greater than about 2000 Å) is desired, a second deposition cycle, using a higher process gas flow, such as about 200 sccm to about 500 sccm of silane, resulting in a higher deposition rate (about 2000 Å/min.) can be used. If disilane is used, the flow rate can be about 100 sccm to about 300 sccm.

After completing the deposition of the doped polycrystalline or amorphous silicon film, heater is lowered from the process position to the load position and wafer removed from chamber.

What is claimed is:

1. A method of forming a doped silicon film comprising:
   placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor;
   heating the susceptor;
   providing a process gas mix into the process chamber through a shower head located above the susceptor, wherein the process gas mix comprises a silicon source gas, a dopant gas, and a carrier gas, the carrier gas comprising nitrogen (N$_2$); and
   depositing the doped silicon film from the process gas.

2. The method of claim 1 wherein heating the susceptor comprises heating the susceptor to a temperature between about 580° C. and about 740° C.

3. The method of claim 2 wherein the temperature is maintained between about 710° C. and about 740° C. and wherein forming the doped silicon film comprises forming a polycrystalline silicon film.

4. The method of claim 2 wherein the temperature is maintained between about 580° C. to about 620° C. and wherein forming the doped silicon film comprises forming an amorphous silicon film.

5. The method of claim 1 further comprising maintaining a pressure in the process chamber of about 100 Torr to about 350 Torr.

6. The method of claim 1 wherein the silicon source gas is silane (SiH$_4$) or disilane (Si$_2$H$_6$) having a flow rate of between about 50 sccm and about 300 sccm.

7. The method of claim 1 wherein the carrier gas has a nitrogen (N$_2$) flow rate of about 9 slm in the top portion of the process chamber.

8. The method of claim 7 further comprising providing a purge gas flow through the bottom portion of the chamber, wherein the purge gas has a flow rate of about 5 slm.

9. The method of claim 1 wherein the dopant gas comprises phosphine (PH$_3$) and a dilutant such that the dopant gas has a pure dopant flow rate of up to about 3 sccm.

10. The method of claim 1 wherein the dopant gas comprises diboron ($B_2H_6$) and a dilutant such that the dopant gas has a pure dopant flow rate of up to about 3 sccm.

11. The method of claim 1 wherein the dopant gas comprises arsine ($AsH_3$) and a dilutant such that the dopant gas has a pure dopant flow rate of up to about 3 sccm.

12. A method of forming a doped polycrystalline silicon film comprising:

placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor;

heating the susceptor to a temperature between 710–740° C.;

maintaining a pressure between 100–350 Torr in the process chamber;

providing a process gas mix into the process chamber through a shower head located above the susceptor, wherein the process gas mix comprises a silicon source gas, a dopant gas, and a carrier gas, the carrier gas comprising nitrogen ($N_2$) at a flow rate of about 9 slm in the top portion of the chamber; and depositing said doped polycrystalline silicon film from the silicon source gas.

13. The method of claim 12 wherein the silicon source gas is silane ($SiH_4$) or disilane ($Si_2H_6$) having a flow rate of between about 50 sccm and about 300 sccm.

14. The method of claim 12 further comprising providing a nitrogen ($N_2$) purge gas flow through the bottom portion of the chamber, wherein the purge gas has a flow rate of about 5 slm.

15. The method of claim 12 wherein the dopant gas comprises phosphine ($PH_3$) and a dilutant such that the dopant gas has a pure dopant flow rate of up to about 3 sccm.

16. The method of claim 12 wherein the dopant gas comprises diboron ($B_2H_6$) and a dilutant such that the dopant gas has a pure dopant flow rate of up to about 3 sccm.

17. The method of claim 12 wherein the dopant gas comprises arsine ($AsH_3$) and a dilutant such that the dopant gas has a pure dopant flow rate of up to about 3 sccm.

18. A method of forming a doped amorphous silicon film comprising:

placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor;

heating the susceptor to a temperature between 580–620° C.;

maintaining apressure between 100–350 Torr in the process chamber;

providing a process gas mix into the process chamber through a shower head located above the susceptor, wherein the process gas mix comprises a silicon source gas, a dopant gas, and a carrier gas, the carrier gas comprising nitrogen ($N_2$) at a flow rate of about 9 slm in the top portion of the chamber; and depositing said doped amorphous silicon film from the silicon source gas.

19. The method of claim 18 wherein the silicon source gas is silane ($SiH_4$) or disilane ($Si_2H_6$) having a flow rate of between about 50 sccm and about 300 sccm in a first process gas cycle.

20. The method of claim 18 further comprising providing a nitrogen ($N_2$) purge gas flow through the bottom portion of the chamber, wherein the purge gas has a flow rate of about 5 slm.

21. The method of claim 18 wherein the dopant gas comprises phosphine ($PH_3$) and a dilutant such that the dopant gas has a pure dopant flow rate of up to about 3 sccm.

22. The method of claim 18 wherein the dopant gas comprises diboron ($B_2H_6$) and a dilutant such that the dopant gas has a pure dopant flow rate of up to about 3 sccm.

23. The method of claim 18 wherein the dopant gas comprises arsine ($AsH_3$) and a dilutant such that the dopant gas has a pure dopant flow rate of up to about 3 sccm.

24. The method of claim 19 further comprising providing a second process gas cycle of silicon source gas including silane at a flow rate of about 200 sccm to about 500 sccm.

25. The method of claim 19 further comprising providing a second process gas cycle of silicon source gas including disilane at a flow rate of about 100 sccm to about 300 sccm.

26. A method of forming a doped silicon film comprising:

placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor;

heating the susceptor;

providing a process gas mix into the process chamber through a shower head located above the susceptor, wherein the process gas mix comprises a silicon source gas, a dopant gas, and a carrier gas mix, the carrier gas mix comprising nitrogen ($N_2$) and hydrogen ($H_2$); and depositing the doped silicon film from the process gas.

27. The method of claim 26 wherein said hydrogen ($H_2$) gas comprises at least 8% by volume of said carrier gas mix.

28. The method of claim 27 wherein heating the susceptor comprises heating the susceptor to a temperature between about 580° C. and about 740° C.

29. The method of claim 28 wherein the temperature is maintained between about 710° C. and about 740° C. and wherein forming the doped silicon film comprises forming a polycrystalline silicon film.

30. The method of claim 28 wherein the temperature is maintained between about 580° C. to about 620° C. and wherein forming the doped silicon film comprises forming an amorphous silicon film.

31. The method of claim 27 further comprising maintaining a pressure in the process chamber of about 100 Torr to about 350 Torr.

32. The method of claim 27 wherein the silicon source gas is silane ($SiH_4$) or disilane ($Si_2H_6$) having a flow rate of between about 50 sccm and about 300 sccm.

33. The method of claim 27 wherein the carrier gas has a nitrogen ($N_2$) flow rate of about 9 slm in the top portion of the process chamber.

34. The method of claim 33 further comprising providing a purge gas flow through the bottom portion of the chamber, wherein the purge gas has a flow rate of about 5 slm.

35. The method of claim 26 wherein the dopant gas comprises phosphine ($PH_3$) and a dilutant such that the dopant gas has a pure dopant flow rate of up to about 3 sccm.

36. The method of claim 26 wherein the dopant gas comprises diboron ($B_2H_6$) and a dilutaiit such that the dopant gas has a pure dopant flow rate of up to about 3 sccm.

37. The method of claim 26 wherein the dopant gas comprises arsine ($AsH_3$) and a dilutant such that the dopant gas has a pure dopant flow rate of up to about 3 sccm.

38. A method of forming a doped polycrystalline silicon film comprising:

placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor, heating the susceptor to a temperature between 710–740° C.;

maintaining a pressure between 100–350 Torr in the process chamber;

providing a process gas mix into the process chamber through a shower head located above the susceptor, wherein the process gas mix comprises a silicon, source gas, a dopant gas, and a carrier gas mix, the carrier gas mix comprising nitrogen ($N_2$) and hydrogen ($H_2$) at a flow rate of about 9 slm in the top portion of the chamber; and depositing said doped polycrystalline silicon film from the silicon source gas.

39. The method of claim 38 wherein said hydrogen ($H_2$) comprises at least 8% by volume of said carrier gas mix.

40. A method of forming a doped amorphous silicon film comprising:

placing a substrate onto a susceptor, the susceptor comprising a body having a resistive heater therein and a thermocouple in physical contact with the resistive heater, the susceptor being located in a process chamber such that the process chamber has a top portion above the susceptor and a bottom portion below the susceptor;

heating the susceptor to a temperature between 580–620° C.;

maintaining a pressure between 100–350 Torr in the process chamber;

providing a process gas mix into the process chamber through a shower head located above the susceptor, wherein the process gas mix comprises a silicon source gas, a dopant gas, and a carrier gas mix, the carrier gas mix comprising nitrogen ($N_2$) and hydrogen ($H_2$) at a flow rate of about 9 slm in the top portion of the chamber; and depositing said doped amorphous silicon film from the silicon source gas.

41. The method of claim 40 wherein said hydrogen ($H_2$) comprises at least 8% by volume of said dilution gas mix.

* * * * *